United States Patent [19]

Fitzpatrick et al.

[11] Patent Number: 5,030,854

[45] Date of Patent: Jul. 9, 1991

[54] TRANSLATOR CIRCUIT FOR CONVERTING ECL TYPE SIGNALS TO TTL TYPE SIGNALS

[75] Inventors: Mark E. Fitzpatrick; Raymond E. Bloker, both of San Jose, Calif.

[73] Assignee: Gazelle Microcircuits, Inc., Santa Clara, Calif.

[21] Appl. No.: 505,852

[22] Filed: Apr. 5, 1990

[51] Int. Cl.⁵ .............. H03K 19/0175; H03K 19/086
[52] U.S. Cl. .................................. 307/475; 307/455
[58] Field of Search .............. 307/475, 448, 450, 451, 307/455, 296.1

[56] References Cited

U.S. PATENT DOCUMENTS

| | | | |
|---|---|---|---|
| 4,656,374 | 4/1987 | Rapp | 307/475 |
| 4,752,703 | 6/1988 | Lin | 307/451 |
| 4,849,660 | 7/1989 | Hayashi et al. | 307/475 |
| 4,868,427 | 9/1989 | Fitzpatrick et al. | 307/475 |
| 4,871,929 | 10/1989 | Hollstein et al. | 307/475 |
| 4,897,560 | 1/1990 | Saito et al. | 307/455 |
| 4,920,287 | 4/1990 | Hartgring et al. | 307/451 |

Primary Examiner—Stanley D. Miller
Assistant Examiner—Andrew Sanders
Attorney, Agent, or Firm—Skjerven, Morrill, MacPherson, Franklin & Friel

[57] ABSTRACT

The present electrical circuit functions to couple together circuits which may have different signal operating levels, such as circuits having small-swing ECL operating levels and large-swing TTL operating levels. The present circuit outputs a signal which is virtually unaffected by any non-ideal characteristics of transistors comprising the circuit.

23 Claims, 2 Drawing Sheets 5,030,854

TRANSLATOR CIRCUIT FOR CONVERTING ECL TYPE SIGNALS TO TTL TYPE SIGNALS

FIELD OF THE INVENTION

This invention relates to electrical circuits, and more particularly, to electrical circuits which are capable of acting as an interface between circuits having different signal and/or power supply levels.

BACKGROUND OF THE INVENTION

In U.S. Pat. No. 4,868,427, incorporated herein by reference, a translator circuit for converting a small-swing ECL-like (Emitter Coupled Logic) signal to a large-swing TTL-like (Transistor-Transistor Logic) signal is shown and described. In the preferred embodiment of the invention of U.S. Pat. No. 4,868,427, shown in FIG. 5 of U.S. Pat. No. 4,868,427 and reproduced as FIG. 1 herein, transistor Q5 is switched on or off depending upon the difference in magnitudes of the voltages applied to input terminals IN and $\overline{\text{IN}}$. This circuit of FIG. 1 is configured so that the gate-to-source voltage ($V_{GS}$) of transistor Q5 is equal to its threshold voltage when the voltages at terminals IN and $\overline{\text{IN}}$ are equal. Thus, a relatively small deviation in the voltages applied to terminals IN and $\overline{\text{IN}}$ should cause the voltage at node 2 to turn transistor Q5 on or off.

In the translator circuit of FIG. 1, ideally, the voltage at node 1 totally controls the current through transistors Q3 and Q4, configured as current mirrors, and the voltage at node 2 should not affect the current through transistor Q4. However, since transistor Q4 is not an ideal transistor but has some output resistance, calculated using the equation $\Delta V_{DS}/\Delta I_{DS}$, an increased drain voltage at node 2 causes an increased current through transistor Q4, given a fixed $V_{GS}$ of transistor Q4. This, in turn, causes a greater voltage drop across resistor R2, which causes the voltage at node 2 to undesirably lower at a time when the voltage at node 2 is intended to be raised. Conversely, a change in the voltages of terminals IN and $\overline{\text{IN}}$ which causes the voltage at node 2 to swing low would cause the current through transistor Q4 to decrease and thus undesirably raise the voltage at node 2.

This dependence of the drain-to-source current ($I_{DS}$) on the value of the drain-to-source voltage ($V_{DS}$) across transistor Q4 reduces the magnitude of the voltage swing at node 2 in response to the difference in voltages applied to input terminals IN and $\overline{\text{IN}}$. Consequently, this delays the time that transistor Q5, whose control terminal is coupled to node 2, is turned completely on or off and may require higher translator circuit input signal swings to ensure the proper switching of transistor Q5 or to have a sufficient noise margin. Further, this reduced output signal swing requires a more precise tolerance of the various components comprising the translator circuit to ensure that the midpoint of the node 2 swing equals the threshold voltage of transistor Q5 or the threshold voltage of any logic circuit coupled to the output of the translator circuit.

What is needed is an improvement to the circuit of FIG. 1 which makes the current through transistor Q4 substantially totally dependent upon the voltage applied to its gate and not affected by a change of voltage at node 2. This would increase the voltage swing at node 2 and greatly increase the switching speed of a subsequent stage coupled to the translator circuit and improve the reliability of the translator circuit.

SUMMARY

It is accordingly an object of this invention to provide a translator circuit which is capable of acting as an interface between other circuits which may have different voltage signal and/or power supply levels, wherein this translator circuit is constructed to be virtually independent of the output resistance ($\Delta V_{DS}/\Delta I_{DS}$) of the transistors used in the circuit.

Broadly stated, the invention comprises a translator circuit having an input lead for receiving an input voltage signal, and an output lead for providing an output voltage signal to a logic circuit having a certain threshold input voltage signal level. The translator circuit comprises means for receiving a signal of a higher level and a lower level on the input lead and providing a signal of a higher level and a lower level on the output lead, where the higher level input signals are different than the higher level output signals and/or the lower level input signals are different than the lower level output signals.

Further included are means for providing that the output signal value on the output lead of the translator circuit approximately equals the threshold voltage of a logic circuit connected to the output lead when the input signal applied to the translator circuit is midway between its higher and lower level values.

Further included, so as to improve this circuit over the translator circuit described in U.S. Pat. No. 4,868,427, are means to prevent the non-ideal characteristics of transistors comprising the translator circuit from reducing the magnitude of the voltage swing of the output signal.

BRIEF DESCRIPTION OF THE DRAWINGS

Other objects and advantages of the invention will become apparent from a study of the specification and drawings, in which.

DESCRIPTION OF THE PREFERRED EMBODIMENT

Figure 2:
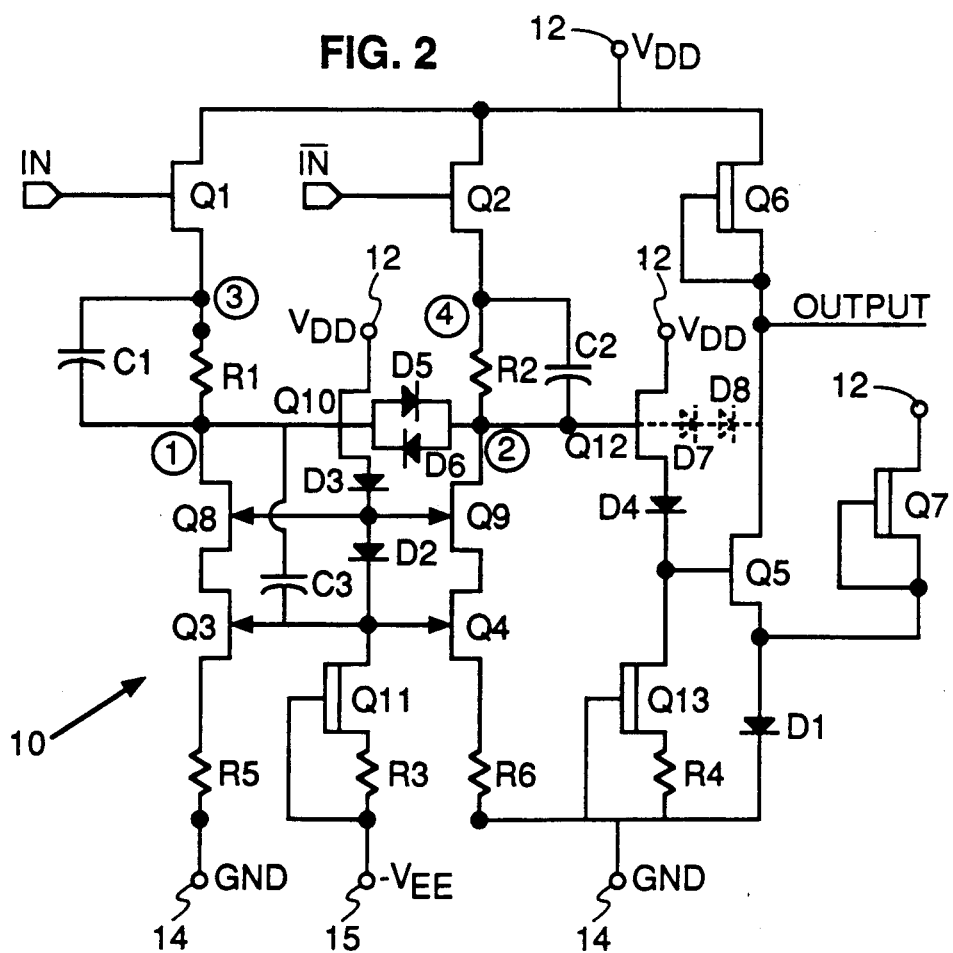
FIG. 2 shows a preferred embodiment of the invention.

FIG. 2 shows a preferred embodiment of the invention. As shown in FIG. 2, translator circuit 10 includes first voltage supply terminal 12, which, in this embodiment, is a positive voltage supply terminal, second voltage supply terminal 14, which, in this embodiment, is a ground terminal, and third voltage supply terminal 15, which, in this embodiment, is a negative voltage supply terminal. Voltage supply terminal 15 is at a negative voltage to ensure proper operation of transistor Q11 if the threshold voltage of transistors Q3 and Q4 is close to zero or a negative voltage. Voltage supply terminal 15 may be connected to ground potential if the threshold voltages of transistors Q3 and Q4 are sufficiently positive.

Enhancement mode field effect transistor Q1 has its gate coupled to input terminal IN, its drain connected to voltage supply terminal 12, and its source connected to capacitor C1 and resistor R1 in parallel, which join at node 1. Node 1 is connected to the drain of enhancement mode field effect transistor Q8, which has its source connected to the drain of enhancement mode field effect transistor Q3. The source of transistor Q3 is connected to ground terminal 14 through low value resistor R5. Resistor R5 is used to improve the matching of current through transistors Q3 and Q4 and may be eliminated if these transistors are sufficiently matched. Similarly, enhancement mode field effect transistor Q2 has its gate connected to input terminal $\overline{IN}$, its drain connected to voltage supply terminal 12, and its source connected to capacitor C2 and resistor R2 in parallel, which join at node 2. Node 2 is connected to the drain of enhancement mode field effect transistor Q9, which has its source connected to the drain of enhancement mode field effect transistor Q4. The source of transistor Q4 is connected to ground terminal 14 through low value resistor R6, whose value and function are identical to the value and function of resistor R5. The gates of transistors Q3 and Q4 are connected together by a conductor, and the gates of transistors Q8 and Q9 are connected together by a conductor.

In alternative embodiments, transistors Q1 and Q2, which merely act as voltage buffers, may be any signal source. For example, transistors Q1 and Q2 may be replaced by signal generators Additionally, one input voltage may be a reference voltage while the other input voltage is the information signal.

A level shifter network is formed between voltage supply terminal 12 and voltage supply terminal 15 by the serial connection of enhancement mode field effect transistor Q10, diode D3, diode D2, depletion mode field effect transistor Q11, and resistor R3. Transistor Q11 and resistor R3 act as a current source to forward bias diodes D3 and D2. The gate of transistor Q10 is connected to node 1. The cathode of diode D3 is connected to the gates of transistors Q8 and Q9, while the cathode of diode D2 is connected to the gates of transistors Q3 and Q4.

In an alternative embodiment, a resistor is placed between the source of transistor Q10 and diode D3 to create an additional voltage drop in order to match the midpoint of the output voltage at node 2 to the threshold voltage of a subsequent stage logic circuit to be switched by the output of translator circuit 10. Further, diode D3 may be eliminated and the gates of transistors Q8 and Q9 can be connected to any reference voltage, since the current through these transistors is determined by the current through transistors Q3 and Q4.

As the voltage applied to terminal IN increases and the voltage applied to terminal $\overline{IN}$ decreases, the gate voltage of transistor Q1 will be increased, and the gate voltage of transistor Q2 will be decreased. In this situation, since the current through transistor Q1 must be the same as the current through transistors Q3 and Q8, the source voltage of transistor Q1 will initially increase along with its increased gate voltage because the current through transistor Q1 cannot change without the current through transistors Q3 and Q8 changing. This initial increase in the source voltage of transistor Q1 causes an initial small increase in the voltage at node 1, which causes a corresponding increase in voltage at the gates of transistors Q8 and Q3. Diodes D2 and D3 merely serve to level shift the voltage at node 1 for purposes which will be explained later. The increased voltage at the gates of transistors Q3 and Q8 causes an increased current to flow through transistors Q1, Q8, and Q3. At the same time, the source voltage of transistor Q1 is slightly lowered, since the increased current through transistor Q1 requires a greater gate-to-source voltage ($V_{GS}$) of transistor Q1. Further, the increased current through resistor R1 causes an increased voltage drop across resistor R1, which results in the voltage at node 1 being not significantly changed from its magnitude prior to the time the voltage applied to terminal IN was raised. Thus, due to the change in current flow through transistors Q1, Q8 and Q3, the voltage at node 1 always balances at about the same level.

Since transistors Q3 and Q4 have their gates coupled together and have essentially the same source voltages, transistors Q3 and Q4 have the same $V_{GS}$ and, consequently, draw the same currents. Transistors Q8 and Q9, coupled in series with transistors Q3 and Q4, respectively, necessarily draw the same increased current as transistors Q3 and Q4 in response to an increased voltage applied to terminal IN. Since the voltage at terminal $\overline{IN}$ has decreased during the time the voltage at terminal IN has increased, the source voltage of transistor Q2 decreases both due to the drop in the gate voltage of transistor Q2 and due to the increased current through transistors Q9 and Q4. Additionally, the increased current causes an increased voltage drop across resistor R2 which further reduces the voltage at node 2. Thus, the voltage at node 2 is affected by both the increased voltage at terminal IN and by the decreased voltage at terminal $\overline{IN}$.

Capacitor C2 acts to quickly pull node 2 up when the input voltage applied to terminal $\overline{IN}$ increases. Without capacitor C2, the parasitic capacitances in the circuit in conjunction with resistor R2 would cause a slight delay in the raising of node 2. Capacitor C1 acts to help pull node 2 down, since as the voltage at input terminal IN increases and creates a high dv/dt across capacitor C1, the increase in input voltage is immediately reflected at node 1. Thus, an increased voltage is more quickly applied to the gates of transistors Q3 and Q4 to pull node 2 down. Capacitor C3 couples node 1 to the gates of transistors Q3 and Q4 and acts to cause the raising of the voltage at node 1 to immediately be applied to the gates of transistors Q3 and Q4.

Since capacitors C1 and C2 are chosen to offset parasitic capacitances in the circuit, the capacitance values are dependent upon the actual circuit implemented. Applicants have found the ratio of $C1 \simeq 2C2 + C_{node2}$, where $C_{node2}$ is the effective capacitance on node 2 as seen by resistor R2, to yield acceptable capacitance values.

The voltage at node 2 is coupled to the gate of enhancement mode field effect transistor Q12, whose drain is connected to voltage supply terminal 12. The source of transistor Q12 is coupled to an anode of diode D4, whose cathode is connected to a current source comprising depletion mode field effect transistor Q13 and resistor R4. Transistor Q12, diode D4, transistor Q13, and resistor R3 form a level shifter for level shifting the output of translator 10 for application to a subsequent stage logic circuit.

The cathode of diode D4 is coupled to the gate of transistor Q5, whose source is coupled to ground terminal 14 via diode D1 and whose drain is coupled to voltage supply terminal 12 through depletion mode field effect transistor Q6 connected as a current source. Transistor Q6 acts as a pull-up means. Transistor Q5 and associated components may be considered to represent a logic circuit coupled to the output of translator circuit 10.

The source of transistor Q5 is also coupled to voltage supply terminal 12 through transistor Q7 connected as a current source for supplying a biasing current through diode D1 so that diode D1, acting as a level shifter, raises the source of transistor Q5 to one diode drop above ground potential. Diode D1 is recommended to ensure the voltage applied to the gate of transistor Q5 is sufficient to turn off transistor Q5 even if the threshold voltage of transistor Q5 is close to zero or a negative voltage. The circuit portion comprising transistors Q6, Q5, Q7 and diode D1 may be considered to be part of a logic circuit with which the translator circuit 10 is operatively associated.

In the case of the voltage at terminal IN increasing and the voltage at terminal $\overline{\text{IN}}$ decreasing, the decreased voltage at node 2 is level shifted by the $V_{GS}$ drop across transistor Q12 and the diode drop across diode D4, and this level shifted voltage is applied to the gate of transistor Q5. Thus, a decreased node 2 voltage will cause transistor Q5 to become less conductive and cause the output at the drain of transistor Q5 to increase in voltage.

Conversely, if the voltage applied to terminal IN were decreased and the voltage applied to terminal $\overline{\text{IN}}$ were increased, the voltage at node 1 would initially decrease, causing transistors Q8 and Q3 to become less conductive. Node 1 would then return to its essentially balanced level. Since the gates of transistors Q9 and Q4 are coupled to the gates of transistors Q8 and Q3, transistors Q9 and Q4 will also become less conductive. Accordingly, the source voltage of transistor Q2 increases primarily due to the increased gate voltage applied to transistor Q2 and, in small part, due to the reduced current flowing through transistors Q9 and Q4. Additionally, the reduced current causes a reduced voltage drop across resistor R2. These simultaneous events cause the voltage at node 2 to increase so as to apply an increased voltage to the gate of transistor Q5. Transistor Q5 becomes more conductive and pulls the output low.

In a preferred embodiment, the entire circuit of FIG. 2 is implemented in compound semiconductor technology, which, in this particular example, is gallium arsenide technology. However, the transistors in FIG. 2 may be any type of transistors.

The circuit of FIG. 2 is particularly useful when using GaAs technology, since all components used in the circuit of FIG. 2 are easily implemented in GaAs technology. No insulated gate devices are used, and since the $V_{GS}$ voltages used can be very low, GaAs devices may be used without the devices' intrinsic gate/source diodes becoming forward biased.

As described in U.S. Pat. No. 4,868,427, diode D1 is inserted between ground terminal 14 and the source of transistor Q5 as a level shifter to insure that transistor Q5 can be adequately turned off by a voltage applied to its gate, since fabrication or temperature variances may cause transistor Q5 to have a close to zero or negative threshold voltage. Also discussed in U.S. Pat. No. 4,868,427 is the need for diode D2 to level shift the voltage applied to the gates of transistors Q3 and Q4 so that the voltage at nodes 1 and 2 may be balanced at the threshold voltage of transistor Q5 when input signals applied to terminals IN and $\overline{\text{IN}}$ are equal. However, diode D2 is not needed if transistors Q3 and Q4 have a sufficiently positive threshold voltage and diode D1 is deleted as not being required to enable transistor Q5 to be switched fully off.

Diode D3 is inserted between the source of transistor Q10 and the gates of transistors Q8 and Q9 as a level shifter to insure that transistors Q8 and Q9 can be adequately controlled if transistors Q10, Q8, and Q9 all have a threshold voltage of zero or a negative value. Diode D3 may be shorted out if the threshold voltage of transistors Q8 and Q9 is a negative voltage and the threshold voltage of transistor Q10 is greater than the absolute value of the threshold voltage of transistors Q8 and Q9.

Diode D4 is inserted as a level shifter between the source of transistor Q12 and the gate of transistor Q5 to match the diode drop across diode D3.

In a preferred embodiment, transistors Q3, Q4, Q8, Q9, and Q5 are sized to have substantially equal current densities during operation so that they will all have substantially similar $V_{GS}$ values. Transistors Q10 and Q12 are sized to have substantially equal current densities so as to have substantially similar $V_{GS}$ values. Transistors Q11 and Q13 are sized to have substantially equal current densities so as to have substantially similar $V_{GS}$ values, given that resistors R3 and R4 have equal values.

Accordingly, the voltage drops across all transistors having similar current densities, and all diodes having similar voltage drops, will cause the voltage at the gate of transistor Q5 to be at the threshold voltage of the logic circuit containing transistor Q5 when the voltages at nodes 1 and 2 are equal. Further, given the above-described characteristics of the various transistors and diodes in the preferred embodiment, when a certain $V_{GS}$ appears across the gate/source of transistor Q5, a similar $V_{GS}$ will appear across the gate/source of transistors Q3, Q4, Q8 and Q9.

Since the $V_{GS}$ of transistors Q3, Q4, Q8, Q9, and Q5 are assumed to be substantially equal, equations 1 and 2 show that the voltage at node 2 substantially equals the voltage necessary to apply a voltage to the gate of transistor Q5 equal to the threshold voltage of the logic circuit containing transistor Q5 when voltages applied to terminals IN and $\overline{\text{IN}}$ are equal.

When voltages at terminals IN and $\overline{\text{IN}}$ are equal, the voltage at node 1 substantially equals that at node 2, where the voltage at node 1 equals, $$V_{GSQ3} + V_{D2} + V_{D3} + V_{GSQ10}, \quad \text{(eq. 1)}$$

where, $V_{GSQ3}$ is the $V_{GS}$ of transistor Q3;
$V_{D2}$ is the voltage drop across diode D2;
$V_{D3}$ is the voltage drop across diode D3; and
$V_{GSQ10}$ is the $V_{GS}$ of transistor Q10.

Also, when voltages applied to terminals IN and $\overline{\text{IN}}$ are equal, causing voltages at nodes 1 and 2 to be equal, the voltage at node 1 has been set such that the voltage at node 2 substantially equals, $$V_{D1} + V_{GSQ5} + V_{D4} + V_{GSQ12}, \quad \text{(eq. 2)}$$

where, $V_{D1}$ is the voltage drop across diode D1;
$V_{GSQ5}$ is the $V_{GS}$ of transistor Q5;
$V_{D4}$ is the voltage drop across diode D4; and
$V_{GSQ12}$ is the $V_{GS}$ of transistor Q12.

By cancelling out like values in equations 1 and 2, it is seen that the voltage at node 2 does indeed equal the voltage necessary to bias the gate of transistor Q5 at the threshold voltage of the logic circuit containing transistor Q5 when the voltage at terminals IN and $\overline{\text{IN}}$ are equal.

Preferably, small-swing complementary ECL type signals are applied to input terminals IN and $\overline{\text{IN}}$, where the voltages applied to terminals IN and $\overline{\text{IN}}$ move in opposite directions to create a voltage differential between IN and $\overline{\text{IN}}$. Thus, since all transistors in FIG. 2 have threshold voltages applied to their gates when the voltages applied to terminals IN and $\overline{\text{IN}}$ are equal, only relatively small differences in input voltages are needed to turn transistor Q5 completely on or completely off.

Figure 1:
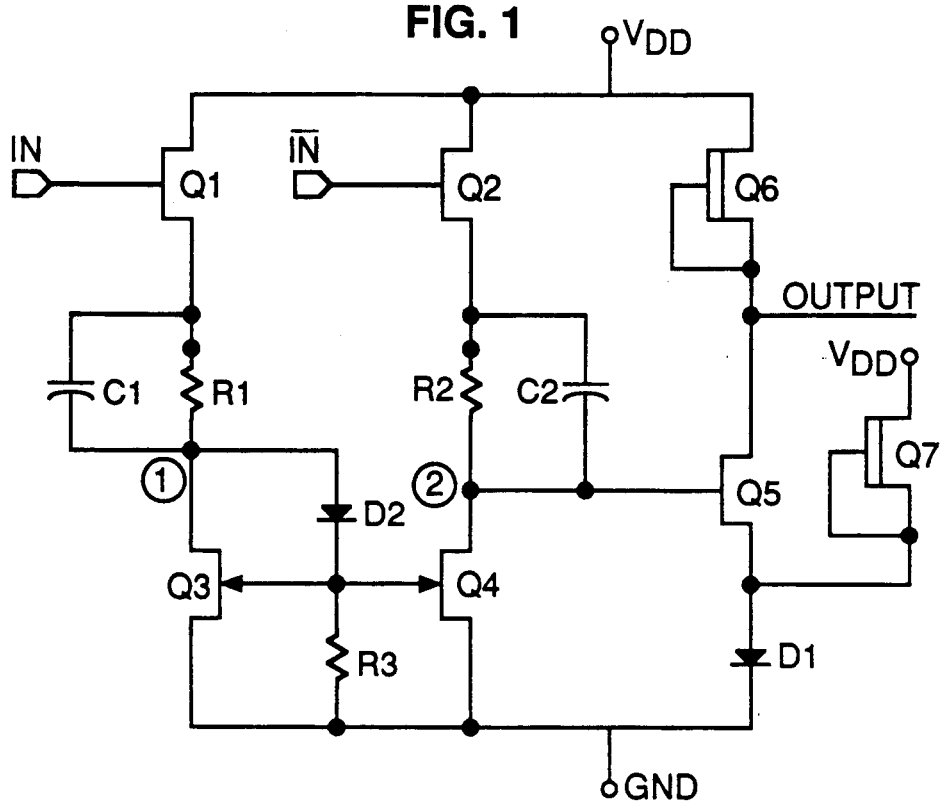
FIG. 1 shows a schematic of the translator circuit described in U.S. Pat. No. 4,868,427.
Figure 3:
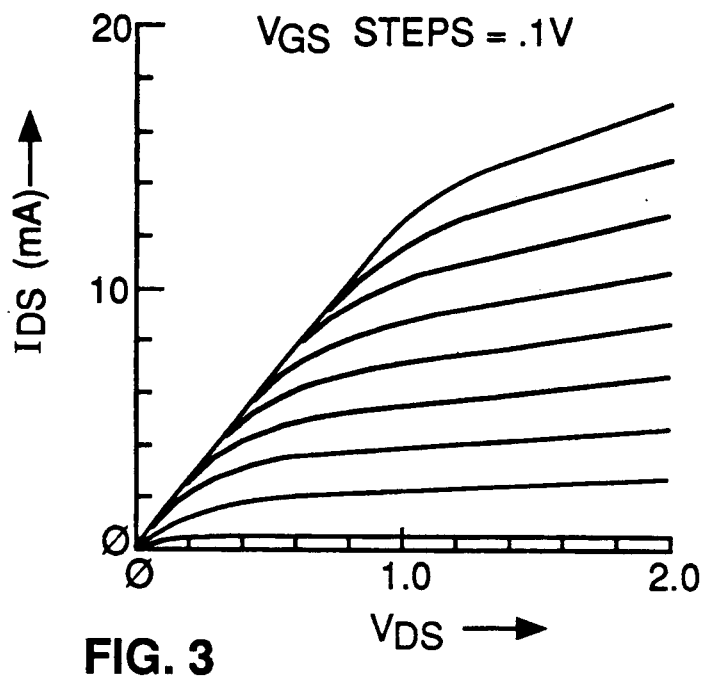
FIG. 3 shows a family of $I_{DS}$ vs. $V_{DS}$ curves for a typical FET with $V_{GS}$ as a parameter.

As previously explained, the circuit of FIG. 1 has a drawback in that the voltage at node 2 is undesirably affected by the current through transistor Q4 due to the finite output impedance of transistor Q4, where a change in the drain-to-source voltage of transistor Q4 causes a change in current through transistor Q4. This $\Delta V_{DS}/\Delta I_{DS}$ is illustrated in the graph of FIG. 3. This undesirably limits the slope and magnitude of the voltage swing at node 2 and at the gate of transistor Q5.

The function of transistors Q8 and Q9 to increase the voltage swing at node 2 and to overcome the problems described above and described in the "Background of the Invention" will now be explained.

To isolate the swing of voltage at node 2 from the drain of transistor Q4, the drain of transistor Q4 is isolated from node 2, as shown in FIG. 2, by transistor Q9. Although, in FIG. 2, the voltage at node 1 does not significantly change, transistor Q8 is inserted between node 1 and the drain of transistor Q3 so that the same current flows through transistor Q4 as flows through transistor Q3.

The insertion of transistor Q9 between node 2 and the drain of transistor Q4 causes the drain voltage of transistor Q4 to be equal to:

$$V_{GSQ4} + V_{D2} - V_{GSQ9}, \qquad \text{(eq. 3)}$$

where, $V_{GSQ4}$ equals the $V_{GS}$ of transistor Q4;
$V_{D2}$ equals the voltage drop across diode D2; and
$V_{GSQ9}$ equals the $V_{GS}$ of transistor Q9.

If transistors Q4 and Q9 are made to have the same current density under similar operating conditions, then $V_{GSQ9}$ will approximately equal $V_{GSQ4}$, and the drain voltage of transistor Q4 will be held relatively constant at about $V_{D2}$. Due to the non-ideal characteristics of transistor Q9, a large increase in voltage at node 2 will cause a slight increase in the source voltage of transistor Q9 in order to slightly reduce the $V_{GS}$ of transistor Q9. However, this resulting raising of the drain voltage of transistor Q4 would have a negligible effect on the current through transistor Q4, since the resulting rise is small relative to the swing at node 2.

Since the source of transistor Q4 is connected to ground and the drain voltage is relatively constant, the current through transistor Q4 is now solely dependent upon the voltage at node 1 and not significantly affected by the voltage swings at node 2.

As briefly stated above, although a swing in voltage at node 1 or node 2 would not affect the current through transistors Q8 or Q9 due to any $\Delta V_{DS}/\Delta I_{DS}$, the $V_{GS}$ of these transistors changes very slightly with relatively large swings in $V_{DS}$ due to these transistors having non-ideal operating characteristics as shown in FIG. 3. Since the change in $V_{GS}$ is small with respect to a change in $V_{DS}$, transistors Q8 and Q9 can be considered to act as voltage amplifiers, while transistors Q3 and Q4 are considered to act as current amplifiers.

The current densities of transistors Q11 and Q13 are substantially matched, and the values of resistors R3 and R4 are made equal, so that substantially identical voltage drops appear across diodes D2, D3, and D4. Transistor Q7 is of a size so that the voltage drop across diode D1 will be close to that across diodes D2, D3, and D4.

It is possible to eliminate the level shifter comprising transistor Q12, diode D4, and transistor Q13 by choosing the appropriate values of the various FETs to cause the voltage applied to the gate of transistor Q5 to be at the threshold voltage of the logic circuit containing transistor Q5 irrespective of the voltage level at node 1 when the input voltages applied to terminals IN and $\overline{\text{IN}}$ are equal. For example, if the next logic stage, such as the stage incorporating transistor Q5, had a threshold voltage of $V_{GSQ3} + V_{D2} + V_{D3} + V_{GS10}$ above ground potential, there would be no need for the level shifter comprising transistor Q12, transistor Q13, and diode D4. Of course, any equivalent level shifting means may be used instead of the various level shifting means used in FIG. 2.

In the event that the increased swing at node 2 of the translator circuit of FIG. 2 has positive and negative magnitudes which are undesirably high, the clamping circuit comprising the parallel combination of diodes D5 and D6 may be used. Diodes D7 and D8 could be used in place of diode D6, but are not needed if diode D6 is used. If no clamping is desired, diodes D5, D6, D7, and D8 would be eliminated.

Figure 4:
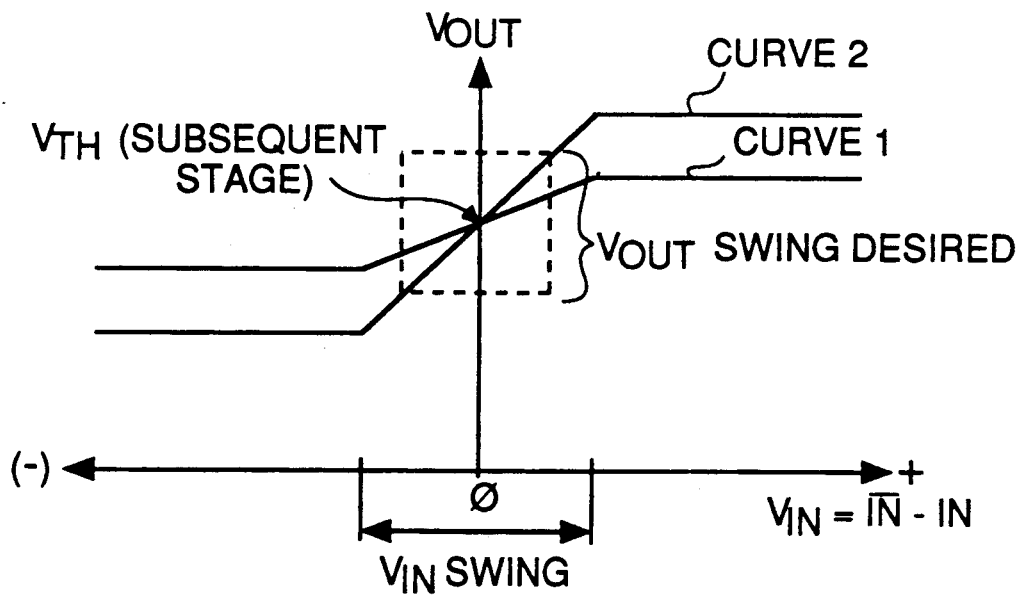
FIG. 4 is a graph showing the output signal of the translator circuit on the Y axis vs. the input signal difference on the X axis.

To illustrate the need and the effects of these diodes, reference is made to FIG. 4. In FIG. 4, curve 1 represents the output of the translator circuit described in U.S. Pat. No. 4,868,427, wherein the output voltage swing of the translator circuit is centered about the threshold voltage of a logic circuit coupled to the output of the translator circuit. This output of the translator circuit swings in a positive or negative direction depending on the difference in value of the input voltages. In the translator circuit represented by curve 1 in FIG. 4, the slope and magnitude of the swing of the output voltage with respect to the difference in input voltages is made lower by the characteristics of the non-ideal transistors used. Curve 2 shows the increased slope and magnitude of the output voltage swing using the preferred embodiment of the circuit shown in FIG. 2, where the non-ideal characteristics of the transistors used have a very limited effect on the magnitude of the output voltage.

Thus, using the circuit of FIG. 2, transistor Q5, which is controlled by the translator output voltage, is switched on faster and harder, and switched off faster and harder, than would be if coupled to the translator circuit of FIG. 1, described in U.S. Pat. No. 4,868,427.

If the transistor of the subsequent stage, such as transistor Q5 in FIG. 2, is sufficiently controlled with a more limited output swing, this output swing may be limited, such as to the portion enclosed by the dashed outline in FIG. 4, by the inclusion of diodes D5 and D6 in the circuit of FIG. 2.

By using diodes D5 and D6, if node 2 swings a diode drop below node 1, diode D5 will turn on, which causes any additional current to flow from node 1 into transistor Q9. Thus, current is tapped off node 1, which prevents this current from flowing through transistors Q8 and Q3. This clamping of the current through transistors Q8 and Q3 causes an equivalent clamping of current through transistors Q9 and Q4, since these transistors act as current mirrors to transistors Q8 and Q3, respectively. Thus, the insertion of diode D5 causes the voltages at nodes 1 and 2 to remain clamp at a one diode drop differential.

Diode D6 operates to clamp node 2 to one diode drop above node 1 as node 2 tries to further rise above node 1. In this situation, current from node 2 flows through diode D6 and through transistors Q8 and Q3 so that the current through transistors Q9 and Q4 are maintained at a constant current level until node 2 is lowered to below one diode drop above node 1.

Thus, using diodes D5 and D6, the magnitude of the swing of node 2 is constrained to one diode drop. If a larger or smaller output voltage swing is desired, appropriate diode drops or other clamping means are to be substituted for diodes D5 and D6.

In another embodiment, clamping means comprising diodes D7 and D8 could be substituted for diode D6, wherein diodes D7 and D8 are serially connected between node 2 and the drain of transistor Q5. Thus, node 2 is clamped to two diode drops above the drain of transistor Q5. Hence, only after transistor Q5 turns on and the drain of transistor Q5 falls two diode drops below the voltage at node 2 do diodes D7 and D8 perform a clamping action to clamp the voltage at node 2 so as to prevent transistor Q5 from further turning on.

Therefore, one may incorporate diodes D7 and D8 if it is desired to provide some overdrive voltage to the stage including transistor Q5 to switch transistor Q5 faster. When transistor Q5 finally switches, the overdrive can be removed or clamped so that transistor Q5 is now ready to switch in the opposite direction with the full benefit of the high level gate voltage being clamped.

It should be understood that any type of clamping means would operate as well as diodes D5, D6, D7 and D8 including clamping means providing other levels of voltage drops. It should also be understood that any of several types of passive clamps could be connected directly to the drain of transistor Q9 and either coupled to ground terminal 14, voltage supply terminal 12, or some other reference level.

Other advantages of the circuit of FIG. 2 over the circuit described in U.S. Pat. No. 4,868,427 include the addition of transistors Q11 and Q10 to provide the necessary bias current through diodes D3 and D2. In this way, no current is taken from node 1 to produce the desired voltage drops across diodes D3 and D2. Essentially no current flows into the gate of transistor Q10, and virtually all current flowing through diode D3, diode D2, current source Q10 and resistor R3 comes from the voltage supply terminal 12 connected to the drain of transistor of Q10.

The preferred embodiment of the present invention is constructed only of components commonly and currently available in GaAs or compound semiconductor technology. For example, the preferred embodiment of the invention does not depend on the use of insulated gate devices or other structures not easily manufacturable in GaAs. In addition, MESFETS used in the preferred embodiment are biased in such a way that the gate to source diode is not generally forward biased or conducting current.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A translator circuit comprising:
a first transistor having a first current handling terminal connected to a first voltage supply terminal and having a second current handling terminal and a current control terminal;
a second transistor having a first current handling terminal connected to said second current handling terminal of said first transistor, a current control terminal coupled to receive a reference voltage, and a second current handling terminal, said second current handling terminal of said second transistor providing an output of said translator circuit;
a first load means coupled between said second current handling terminal of said second transistor and a second voltage supply terminal; and
a bias generator means having an output coupled to said current control terminal of said first transistor, said bias generator means having an input terminal coupled to receive an input signal,
wherein said first transistor, second transistor, bias generator means, and first load means have characteristics such that said output of said translator circuit is at a threshold voltage of a next stage coupled to said output of said translator circuit when an input signal, having a voltage swing, provided at said input terminal of said bias generator means is at substantially a mid-point of its swing.

2. A translator circuit comprising:
a first transistor having a first current handling terminal connected to a first voltage supply terminal and having a second current handling terminal and a current control terminal;
a second transistor having a first current handling terminal connected to said second current handling terminal of said first transistor, a current control terminal coupled to receive a reference voltage, and a second current handling terminal, said second current handling terminal of said second transistor providing an output of said translator circuit;
a first load means coupled between said second current handling terminal of said second transistor and a second voltage supply terminal; and
a bias generator means having an output coupled to said current control terminal of said first transistor, said bias generator means having an input terminal coupled to receive an input signal,
wherein said bias generator means comprises:
a third transistor having a first current handling terminal connected to said first voltage supply terminal, a current control terminal connected to said current control terminal of said first transistor, and a second current handling terminal;
a level shifter means having a first terminal connected to said current control terminal of said third transistor and a second terminal connected to said second current handling terminal of said third transistor; and
a second load means connected between said second current handling terminal of said third transistor and said second voltage supply terminal, and coupled to receive a first input signal.

3. The translator circuit of claim 2 wherein said biasing circuit further comprises:
a fourth transistor having a first current handling terminal connected to said second current handling terminal of said third transistor, a second current handling terminal connected to said second terminal of said first level shifter, and a current control terminal.

4. The translator circuit of claim 3 wherein said current control terminal of said fourth transistor is connected to said current control terminal of said second transistor.

5. The translator circuit of claim 2 wherein said second load means comprises a first input transistor for receiving said first input signal, said first input transistor having a first current handling terminal connected to a first terminal of a third load means, a second terminal of said third load means being coupled to said second terminal of said level shifter means, said first input transistor also having a second current handling terminal connected to said second voltage supply terminal, and having a current control terminal coupled to receive said first input signal.

6. The transistor circuit of claim 5 wherein said first load means comprises a second input transistor for receiving a second input signal, said second input transistor having a first current handling terminal connected to said second current handling terminal of said second transistor through a fourth load means, having a second current handling terminal connected to said second voltage supply terminal, and having a current control terminal coupled to receive said second input signal.

7. The translator circuit of claim 6 wherein said first input signal and said second input signal are complementary signals.

8. The translator circuit of claim 6 wherein said second input signal is a first reference voltage.

9. The translator circuit of claim 8 wherein said level shifter means comprises:
a first level shifter means connected between said current control terminal of said fourth transistor and said second current handling terminal of said fourth transistor, and a second level shifter means coupled between said current control terminal of said fourth transistor and said current control terminal of said third transistor.

10. The translator circuit of claim 9 wherein said first level shifter means comprises a fifth transistor having a first current handling terminal coupled to said current control terminal of said fourth transistor through a third level shifter means, a second current handling terminal coupled to said second supply voltage terminal, and a current control terminal coupled to said second current handling terminal of said fourth transistor.

11. The translator circuit of claim 2 wherein said current control terminals of said first transistor and said third transistor are coupled to a third voltage supply terminal through a current source.

12. A translator circuit comprising:
a first transistor having a first current handling terminal connected to a first voltage supply terminal and having a current control terminal and a second current handling terminal;
a first load means connected to receive a first input signal;
a second transistor having a first current handling terminal connected to said second current handling terminal of said first transistor, a second current handling terminal connected to said first load means, and a current control terminal, an output signal lead of said translator circuit being connected to said second current handling terminal of said second transistor;
a third transistor having a first current handling terminal connected to said first voltage supply terminal and having a current control terminal and a second current handling terminal;
a second load means connected to receive a second input signal;
a fourth transistor having a first current handling terminal connected to said second current handling terminal of said third transistor, a second current handling terminal connected to said second load means, and a current control terminal,
said current control terminal of said first transistor being connected to said current control terminal of said third transistor,
said current control terminal of said second transistor being connected to said current control terminal of said fourth transistor,
said current control terminal of said third transistor being connected to said second load means through a first level shifter means, said control terminal of said third transistor being coupled to a second supply voltage terminal through a third load means,
said current control terminal of said second transistor and said current control terminal of said fourth transistor being connected to receive a reference voltage.

13. The translator circuit of claim 12 wherein said reference voltage is a voltage at said second current handling terminal of said fourth transistor level shifted by a second level shifter means.

14. The circuit of claim 13 wherein said first and second level shifter means each comprise a diode forward biased in a direction from said second current handling terminal of said fourth transistor to said second voltage supply terminal.

15. The translator circuit of claim 14 wherein said first level shifter means and said second level shifter means are connected to said second voltage supply terminal through a current source.

16. The circuit of claim 13 wherein said second level shifter means comprises a fifth transistor having a first current handling terminal coupled to an anode of a first diode means, a second current handling terminal coupled to a third voltage supply terminal, a current control terminal coupled to said second current handling terminal of said fourth transistor, a cathode of said first diode means being coupled to said current control terminal of said fourth transistor.

17. The translator circuit of claim 12 wherein said first input signal is coupled to said first load means through a first input transistor and said second input signal is coupled to said second load means through a second input transistor.

18. The circuit of claim 12 further comprising a clamping means coupled between said second current handling terminal of said second transistor and said second current handling terminal of said fourth transistor.

19. The circuit of claim 12 further comprising a clamping means coupled between said second current handling terminal of said second transistor and a reference level.

20. The translator circuit of claim 12 wherein a third level shifter means is connected to said second current handling terminal of said second transistor for level shifting said output of said translator circuit in order to couple said output to a subsequent stage.

21. The circuit of claim 12 wherein said first through fourth transistors are field effect transistors.

22. The circuit of claim 12 wherein said first through fourth transistos are implemented in compound semiconductor technology.

23. The circuit of claim 22 wherein said first through fourth transistors are implemented in gallium arsenide technology.

* * * * *